United States Patent [19]
Ryu

[11] Patent Number: 5,898,719
[45] Date of Patent: Apr. 27, 1999

[54] OPTICAL FREQUENCY STABILIZER

[75] Inventor: Shiro Ryu, Tokyo, Japan

[73] Assignee: Kokusai Denshin Denwa Kabushiki Kaisha, Tokyo, Japan

[21] Appl. No.: 08/910,943

[22] Filed: Aug. 8, 1997

[30] Foreign Application Priority Data

Aug. 14, 1996 [JP] Japan ................................. 8-214457

[51] Int. Cl.$^6$ .............................. H01S 3/13; G02B 6/28; H04J 14/00
[52] U.S. Cl. ............................... 372/32; 372/29; 385/24; 359/115; 359/117; 359/124; 359/128
[58] Field of Search .................................. 372/29, 32, 9, 372/23; 385/24, 88, 89; 359/115, 117, 124, 127, 128

[56] References Cited

U.S. PATENT DOCUMENTS

| | | | |
|---|---|---|---|
| 5,175,777 | 12/1992 | Bottle | 385/17 |
| 5,191,627 | 3/1993 | Haas et al. | 385/24 |
| 5,331,649 | 7/1994 | Dacquay et al. | 372/23 |
| 5,387,992 | 2/1995 | Miyazaki et al. | 359/124 |
| 5,434,937 | 7/1995 | Glance | 385/24 |
| 5,473,719 | 12/1995 | Stone | 385/123 |
| 5,570,438 | 10/1996 | Fontana et al. | 385/24 |
| 5,654,812 | 8/1997 | Suzuki | 359/139 |
| 5,699,177 | 12/1997 | Yamamoto | 359/125 |
| 5,745,270 | 4/1998 | Koch | 359/124 |
| 5,761,228 | 6/1998 | Yano | 372/26 |

FOREIGN PATENT DOCUMENTS 0521514  1/1993  European Pat. Off. ............. 385/24 X

OTHER PUBLICATIONS

M.W. Maeda et al. "Absolute Frequency Identification and Stabilization of DFB Lasers in 1.54 $\mu$m Region;" Electronics Letters, vol. 25, No. 1, pp. 9–11, 1989.

Primary Examiner—Brian Healy
Attorney, Agent, or Firm—Christie, Parker & Hale, LLP

[57] ABSTRACT

In an optical frequency stabilizing device for stabilizing optical frequencies of transmission lasers even when optical frequency reference is shut off, an optical shutter 44 is normally held in its open state to pass optical frequency reference light from an optical network to an injection-locked laser device 42. An optical multiplexer 46 multiplexes outputs of a injection-locked laser device 42 and transmission laser devices 40-1 through 40-3, and an optical frequency discriminator 48 scans optical output of the multiplexer 46. Opto-electrically converted output of a photodetector 52 is applied to a control device 50 which controls driving currents, etc. of the laser devices 40-1 through 40-3 to adjust optical output frequencies of the laser devices 40-1 to 40-3 to predetermined values relative to the optical output frequency of the injection-locked laser device 42. The control device 50 also closes the optical shutter 44 for a moment, and adjusts the driving current, etc. of the injection-locked laser device 42 to equalize the optical frequency of optical output of the injection-locked laser device 42 during the close state of the optical shutter 44 to the value during the open state of the optical shutter 44.

14 Claims, 7 Drawing Sheets

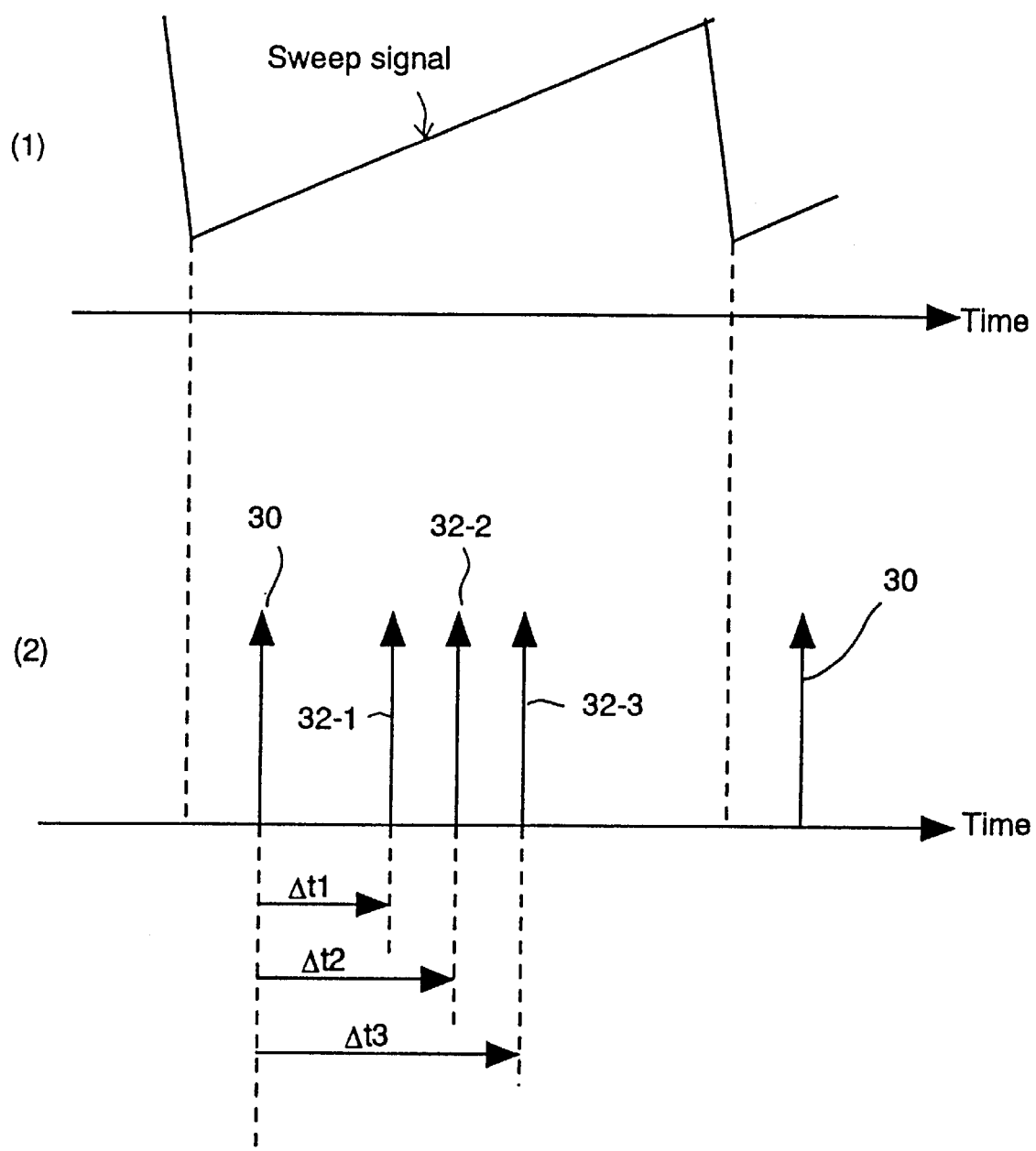

OPTICAL FREQUENCY STABILIZER

FIELD OF THE INVENTION

This invention relates to an optical frequency stabilizer, and more particularly, to an optical frequency stabilizer suitable for optical transmission systems, especially wavelength-division multiplexing optical transmission network.

BACKGROUND OF THE INVENTION

FIG. 5 shows a basic structure of a wavelength-division multiplexed optical transmission network. In wavelength-division multiplexed optical transmission networks, in general, since optical signals of a plurality of adjacent wavelengths are transmitted in a wavelength-division multiplexed form, they need a reference light used as a reference of optical frequencies. Connected to an optical network 10 are a plurality of communication stations 12-1 through 12-7 via optical branching lines 14-1 through 14-7. An optical frequency reference device for generating an optical frequency reference light is provided in the communication station 12-1. The optical frequency reference light output from the communication station 12-1 is sent to the optical network 10 via the optical branching line 14-1, and further to other communication stations 12-2 to 12-7 through the optical branching lines 14-2 to 14-7. From the viewpoint that the communication station 12-1 generates the optical frequency reference light, it is the reference station, and the other communication stations 12-2 through 12-7 are slave stations from the viewpoint that they use the optical frequency reference light from the exterior station 12-1, i.e. the reference station, to stabilize optical frequencies of their own transmission laser devices.

FIG. 6 is a schematic block diagram showing a general construction of a conventional slave station. Its details are discussed by M. W. Maeda, et al. in "Absolute Frequency Identification and Stabilization of DFB Lasers in 1.54 $\mu$m Region", Electronics Letters, Vol. 25, No. 1, pp. 9–11, 1989.

Numerals 20-1, 20-2 and 20-3 denote transmission laser devices for generating transmission optical signals having different wavelengths each other. Their optical outputs and the optical frequency reference light from the network 10 are multiplexed by an optical multiplexer 22 and applied to an optical frequency discriminator 24. Typically used as the optical frequency discriminator 24 is a scanning Fabry-Perot interferometer which converts the optical frequency domain to a time domain by scanning. The optical frequency discriminator 24 repeatedly scans optical outputs of the optical multiplexer 22 over a bandwidth on the optical frequency domain in response to a sweep signal from a control device 26. A photodetector 28 converts an optical output of the optical frequency discriminator 24 into an electric signal, and applies it to the control device 26. By scanning the optical frequency discriminator 24 and by measuring the output level of the photodetector 28 on the time domain, the spectrum of the optical output of the optical multiplexer 22 can be measured.

FIG. 7 shows an example of spectral measurement by the optical frequency discriminator 24. Time along the abscissa corresponds to optical frequencies by scanning. In FIG. 7, (1) is a sweep signal from the control device 26, and (2) is an output of the photodetector 28. Numeral 30 denotes optical frequency reference light from a reference station, and numerals 32-1, 32-2 and 32-3 are optical outputs of the transmission laser devices 20-1, 20-2 and 20-3, respectively. The control device 26 measures sweep times $\Delta t1$, $\Delta t2$ and $\Delta t3$ of the optical outputs 32-1, 32-2 and 32-3 of the transmission laser devices 20-1, 20-2 and 20-3 from the optical frequency reference light 30, and controls drive currents and operation temperatures of the transmission laser devices 20-1, 20-2 and 20-3 so as to maintain the sweep times $\Delta t1$, $\Delta t2$ and $\Delta t3$ at predetermined values. In this manner, optical frequencies of optical outputs of the transmission laser devices 20-1, 20-2 and 20-3 can be stabilized at predetermined values relative to the optical frequency of the optical frequency reference light from the reference station 12-1.

In the conventional frequency stabilizing system, if the optical frequency reference light from the reference station 12-1 is shut off, then the reference for the measurement of time intervals is lost, and behaviors for stabilizing optical frequencies are adversely affected. A possible approach to deal with the situation is to use optical output of one of transmission laser devices (for example, device 20-1) as a provisional optical frequency reference. However, it is not promised that the transmission laser device (e.g. the device 20-1) used as the provisional reference be always used for communication. The output of the device is possibly cut off when it is not used.

It will be possible to hold the output of one of the transmission laser devices used as the provisional optical frequency reference always ON. However, optical demand/assignment systems or optical ATM systems, for example, need the existence of a period of time where the output of the transmission laser device is OFF. Therefore, such systems result in loosing the provisional optical frequency reference during the period and fail in stabilizing the optical frequencies of other transmission optical signals.

When the optical output of the transmission laser device is modulated for data transmission, it is spread over a wide spectral range, which becomes a factor of an error upon determining the reference point on the time base. Therefore, the use of data-modulated transmission light as the provisional optical frequency reference is not desirable.

SUMMARY OF THE INVENTION

It is therefore an object of the invention to provide an optical frequency stabilizing device promising reliable control for stabilizing the frequency of transmission light even when optical frequency reference light is cut off.

According to the invention, instead of using optical frequency reference light itself directly, the optical frequency reference light is once applied to the injection-locked laser means to activate it for laser oscillation at the same frequency as that of the optical frequency reference light and to use optical output of the injection-locked laser device for stabilizing oscillation frequencies of transmission laser devices.

In preparation for periods with no entry of the optical frequency reference light, the optical frequency reference light is intentionally blocked by optical shutter means, and driving conditions are adjusted such that the injection locked laser means oscillates at the same frequency before the shutter means is closed.

Another version of the invention uses means for detecting entry or non-entry of the optical frequency reference light. Then, the device stores a result of measurement of the oscillation frequency of the injection-locked laser device during entry of the optical frequency reference light, and adjusts the oscillation frequency during non-entry of the optical frequency reference light to adjust it to the stored result of measurement.

In this manner, since the injection-locked laser means maintains the oscillation frequency substantially equal to the optical frequency of the optical frequency reference light even during non-entry thereof, optical outputs of the injection-locked laser means can be used reliably as the optical frequency reference to stabilize laser oscillation frequencies of the transmission laser means.

When the device uses optical multiplexer means for multiplexing optical output of the injection-locked laser means and optical output of at least one transmission laser means and spectroscopic means for spectrally measuring the multiplexed wave, it can reduce measurement errors as compared with those by spectroscopic measurement of individual optical outputs of respective laser means, and can reduce interactive affections. When the spectroscopic means comprise optical frequency discriminator means for converting the optical frequency base to a time base, high wavelength resolution can be obtained. When the control means includes time measuring means, transmission laser drive means, injection-locked laser drive means and frequency control means, individual functions are distinctive, and the oscillation frequency of a particular transmission laser means can be stabilized with high accuracy.

When the optical frequency reference light passing through the optical filter is divided into two parts, one being applied to the injection-locked laser means, extraction of the optical frequency reference light may be only once, and need not be repeated.

DESCRIPTION OF THE DRAWINGS

FIG. 7 is a spectral diagram example of optical frequency reference light and transmission laser light.

DETAILED DESCRIPTION OF THE INVENTION

Embodiments of the invention is described below in detail with reference to the accompanying drawings.

Figure 1:
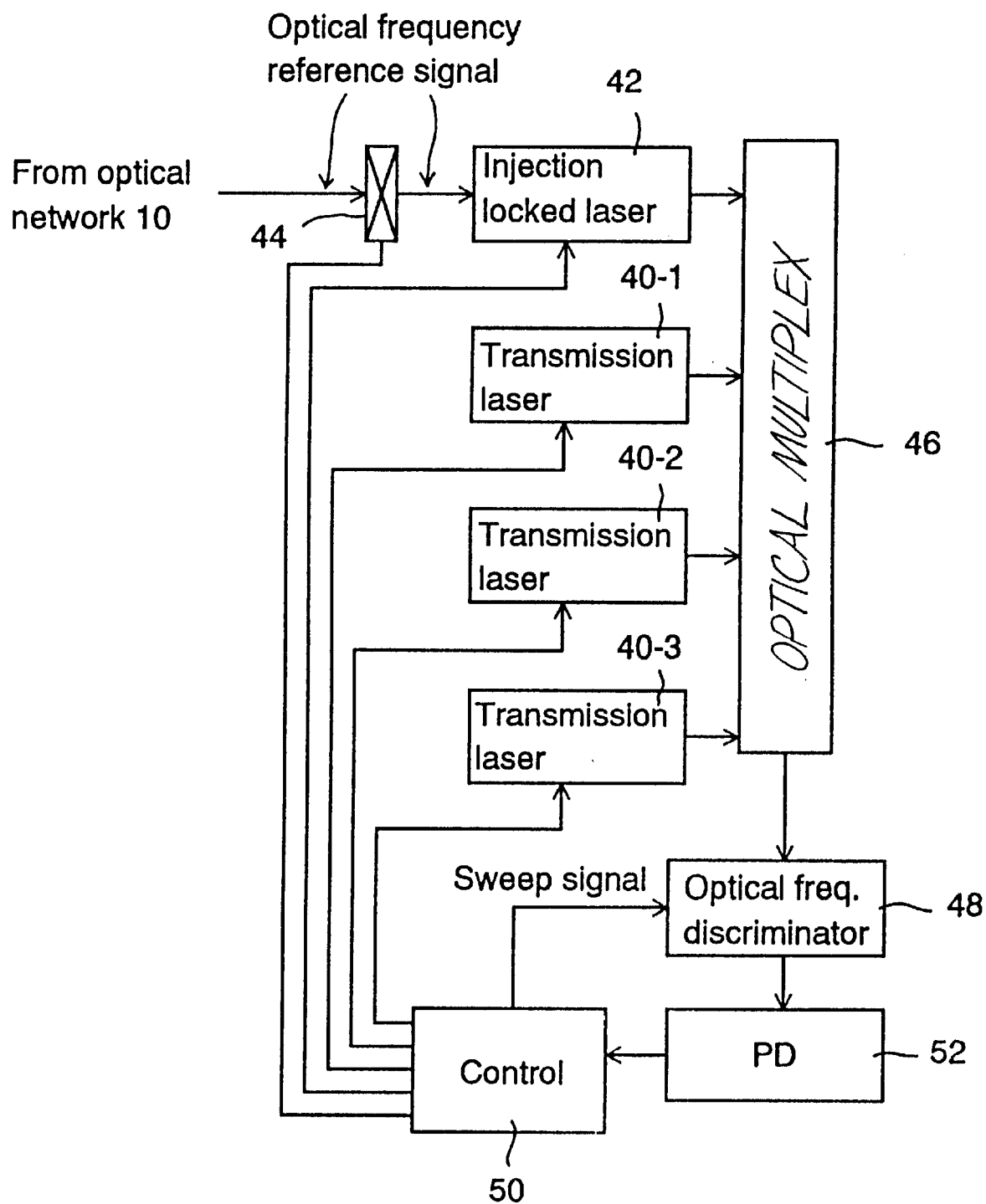
FIG. 1 is a schematic block diagram showing a general construction of a first embodiment of the invention.

FIG. 1 is a schematic block diagram showing a general construction of a first embodiment of the invention. Numerals 40-1, 40-2 and 40-3 denote transmission laser devices each for generating transmission light having a wavelength different from those of the other transmission laser devices. Numeral 42 denotes an injection-locked laser device configured for laser oscillation at the same frequency as that of external light, which is supplied with optical frequency reference light from the optical network 10 via an optical shutter 44. The optical shutter 44, in its open mode, permits the optical frequency reference light from the optical network 10 to pass therethrough and enter the injection-locked laser device 42, and, in its close mode, shuts out the frequency reference light from the optical network 10 toward the injection-locked laser device 42. The reason why the optical shutter 44 is used will be explained later in detail.

Figure 6:
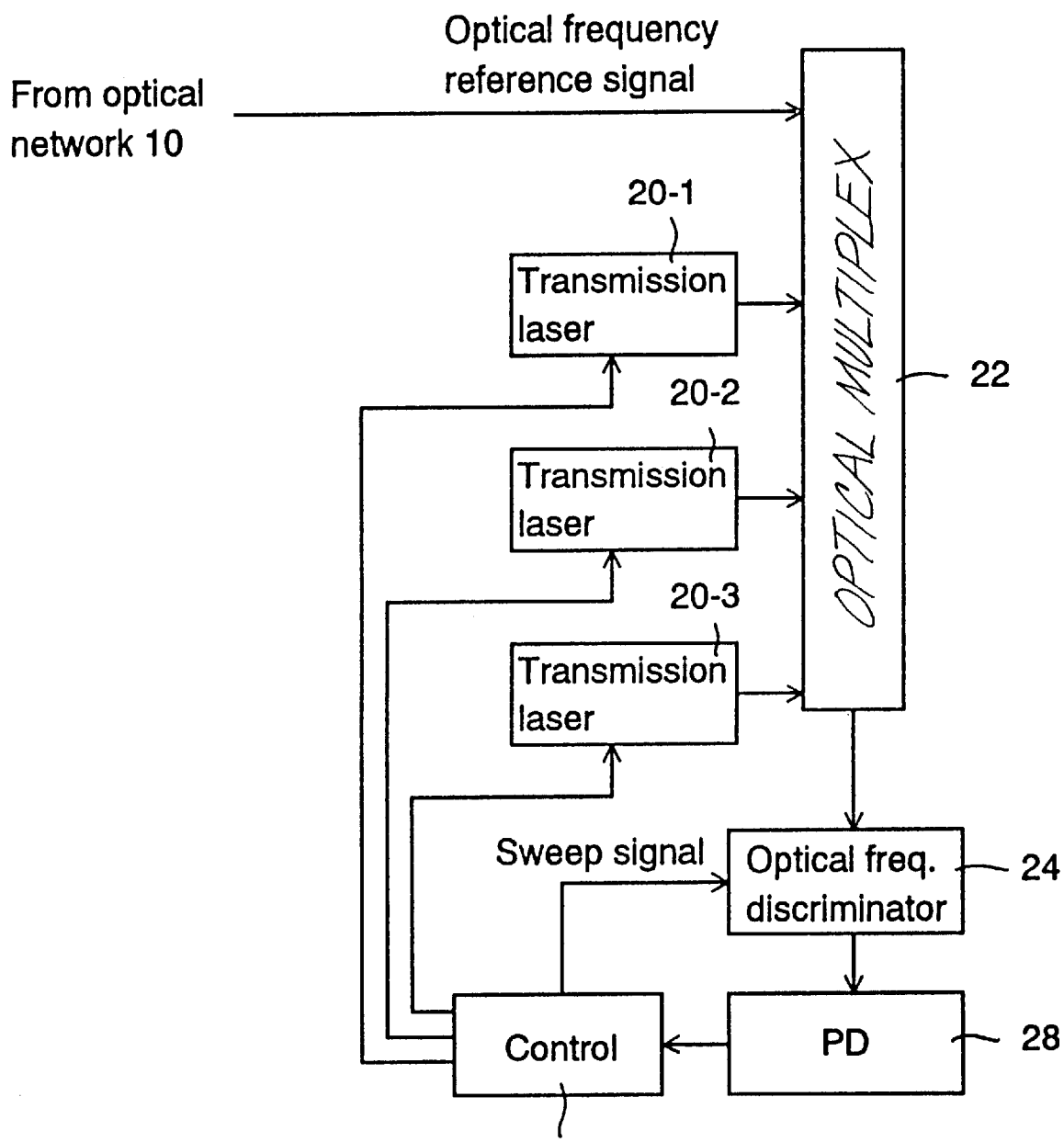
FIG. 6 is a schematic block diagram showing a general construction of conventional slave stations 12-1 through 12-7.

An optical multiplexer multiplexes optical outputs of the transmission laser devices 40-1, 40-2, 40-3 and optical output of the injection-locked laser device 42, and applies the multiplexed signal to an optical frequency discriminator 48. Typically used as the optical frequency discriminator 48, like the optical frequency discriminator 24 (FIG. 6), is a scanning Fabry-Perot interferometer which repeatedly scans optical outputs of the optical multiplexer 46 over a band width on the optical frequency base in response to a sweep signal from a control device 50. A photodetector 52 converts optical output of the optical frequency discriminator 48 into an electric signal, and applies it to the control device 50. Output of the photodetector 52 is in form of pulses which become larger at the timing responsive to optical frequencies of optical outputs of the transmission laser devices 40-1, 40-2, 40-3 and the injection-locked laser device 42. By sweeping the optical frequency discriminator 48 and by measuring the output level of the photodetector 52 on the time base, the spectrum of the optical output of the optical multiplexer 46, namely the spectra of optical outputs from the transmission laser devices 40-1, 40-2, 40-3 and the injection-locked laser device 42 can be analyzed.

In the same way as explained with reference to FIG. 7, the control device 50 measures sweep times Δt1, Δt2 and Δt3 from the output of the injection-locked laser device 42 (its optical frequency coincides with the optical frequency of the optical frequency reference light when the optical frequency reference light is supplied from the optical network 10) to the optical outputs of the transmission laser devices 40-1, 40-2 and 40-3, and controls drive currents and operation temperatures of the transmission laser devices 40-1, 40-2 and 40-3 so as to maintain the sweep times Δt1, Δt2 and Δt3 at predetermined values. In this manner, optical frequencies of optical outputs of the transmission laser devices 40-1, 40-2 and 40-3 can be stabilized at predetermined values relative to the optical frequency of the optical frequency reference light from the reference station 12-1.

Figure 2:
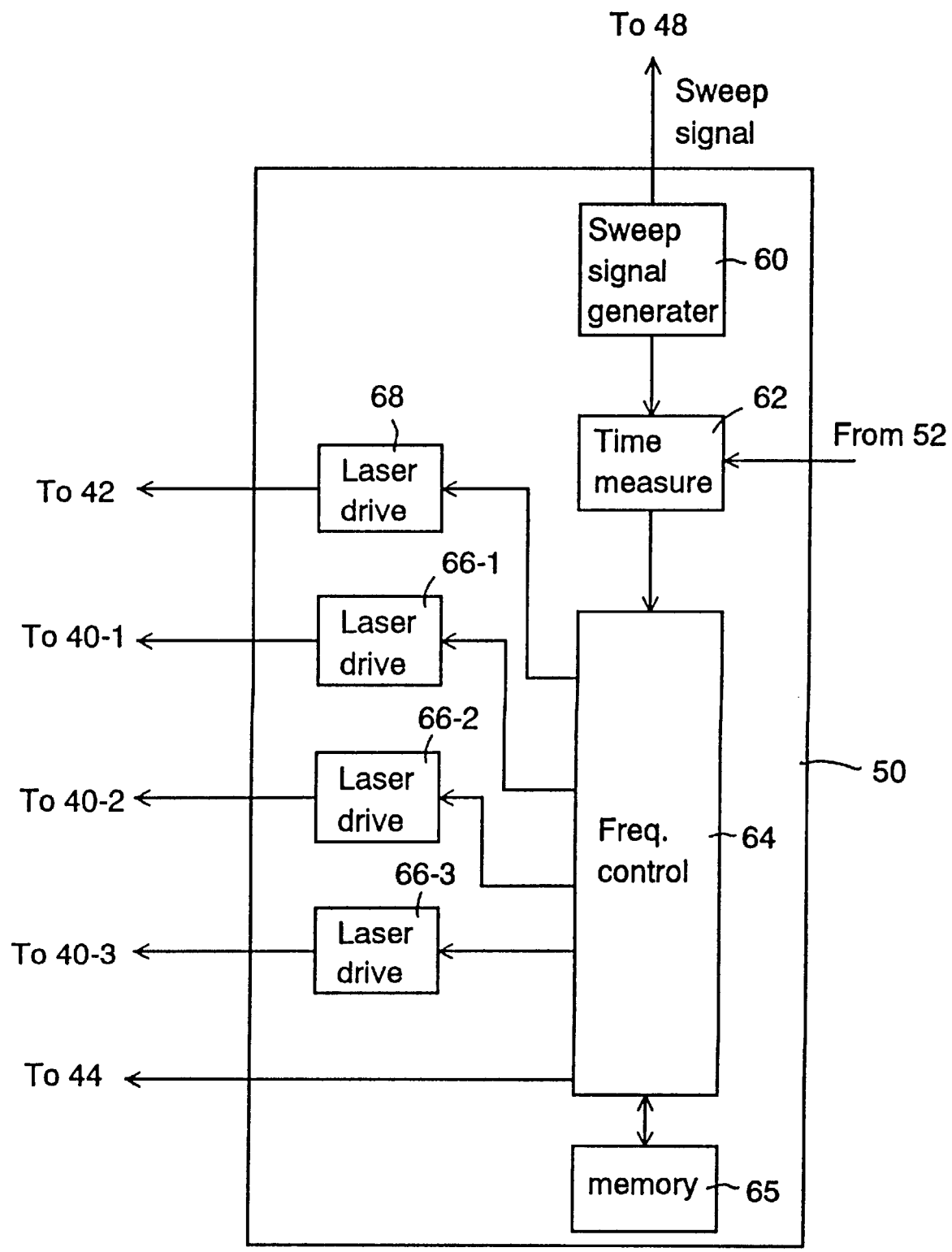
FIG. 2 is a schematic block diagram showing a general construction of a control device 50.

FIG. 2 is a schematic block diagram showing a general construction of the control device 50. A sweep signal generation circuit 60 generates a sweep signal to be applied to the frequency discriminator 48, and supplies a time measuring circuit 62 with a timing signal based on the cycle of the sweep signals. The time measuring circuit 62 is also supplied with output of the photodetector 52, and measures the position of (the rising of) the output pulse of the photodetector 52 on the time base with respect to the start point of time of the sweep cycle of each sweep signal. A result of the measurement is delivered to a frequency control device 64. The frequency control device 64 stores in its memory 65 fixed information and variable information necessary for subsequent controls.

The frequency control device 64 first measures, from the output of the time measuring circuit 62, the time required from the sweep cycle start timing to the optical output of the injection-locked laser device 42 (that is, optical frequency of the optical output of the injection-locked laser device 42) and time differences Δt1, Δt2 and Δt3 required from the optical output of the injection-locked laser device 42 to the optical outputs of the transmission laser devices 40-1, 40-2, 40-3 (that is, optical frequency differences). During normal operations for stabilizing optical frequencies of optical outputs of the transmission laser devices 40-1, 40-2, 40-3, the frequency control device 64 may measure only the time differences (optical frequency differences) from optical output of the injection-locked laser device 42 to optical outputs of the transmission laser devices 40-1, 40-2, 40-3.

The frequency control device 64 preliminarily stores information on time differences responsive to deviations in optical frequencies of optical outputs from the transmission laser devices 40-1, 40-2, 40-3 with respect to the optical frequency of the optical frequency reference light (reference optical frequency) in, for example, the memory 65, and controls laser drive devices 66-1, 66-2, 66-3 to adjust the drive currents, operation temperatures, and so forth, of the transmission laser devices 40-1, 40-2, 40-3. As a result, optical frequencies of optical outputs of the transmission laser devices 40-1, 40-2, 40-3 are made to have desired optical frequency deviations relative to the optical frequency reference light, and are stabilized with reference to the optical frequency of the optical frequency reference light.

Now explained is the reason of using the optical shutter 44. When an external optical signal is applied, the injection-locked laser device 42 oscillates at the same optical frequency as that of the external light. That is, the oscillation frequency is locked to the optical frequency of the external light. Therefore, when the optical frequency reference light enters from the optical network 10, the injection-locked laser device 42 oscillates at the frequency equal to the optical frequency of the optical frequency reference light. However, when the optical frequency reference light does not enter from the optical network 10, the injection-locked laser device 42 oscillates at a frequency determined by an applied drive current and an operation temperature. Even in such conditions, it is necessary for the object of the invention that the oscillation frequency be substantially equal to the reference optical frequency.

In this embodiment, to cope with this requirement, the frequency control device 64 of the control device 50 stores in its memory 65 a result of measurement of the optical frequency of optical output of the injection-locked laser device 42 while the optical frequency reference light enters the injection locked laser device 42 through the optical shutter 44 in its open state, and closes the optical shutter 44 for a moment at an appropriate time or in appropriate intervals. Then, the frequency control device 64 determines operative conditions (drive current, operation temperature and other factors) of the injection-locked laser device 42 such that the measured optical frequency of the optical output from the injection-locked laser device 42 while the optical shutter 44 is closed be substantially equalized to the value of the storage in the memory 65, namely, the optical frequency of optical output of the injection-locked laser device 42 while the optical shutter 44 is opened (that is, the optical frequency of the optical frequency reference light). Since the oscillation frequency may vary with fluctuation in operation temperature, deterioration, and other possible factors, the adjustment is preferably repeated at an appropriate timing or in appropriate intervals.

More specifically, while the optical frequency reference light enters from the optical network 10, the optical shutter 44 is opened. Concurrently, the laser drive device 68 activates the injection-locked laser device 42 for laser oscillation at an optical frequency near to the optical frequency of the optical frequency reference light. Similarly, the optical multiplexer 46, optical frequency discriminator 48 and photodetector 52 are activated. The frequency control device 64 of the control device 50 measures from an output of the time measuring circuit 62 the time required from the start point of a sweep cycle to an optical output of the injection-locked laser device 42 (that is, optical frequency of the optical output of the injection-locked laser device 42), and provisionally stores the result of the measurement in the memory 65.

After that, while the optical shutter 44 is closed (that is, while the optical frequency reference light does not enter), the time required from the start point of a sweep cycle to an optical output of the injection-locked laser device 42 (that is, optical frequency of the optical output of the injection-locked laser device 42) is measured. Then, the frequency control device 64 controls the laser drive device 68 to adjust the drive current, operation temperature, and so forth, of the injection-locked laser device 42 such that the result of the measurement while the optical shutter 44 is closed coincides with the result of the measurement while the optical shutter 44 is opened. After the adjustment, the laser drive device 68 holds the adjusted drive current, operation temperature, etc. for the injection-locked laser device 42.

As a result, the injection-locked laser device 42 oscillates at an optical frequency substantially equal to the reference optical frequency, regardless of deterioration, etc., even when the optical frequency reference light from the optical network 10 is shut off. That is, the optical output of the injection-locked laser device 42 can be used as a provisional optical frequency reference.

Figure 3:
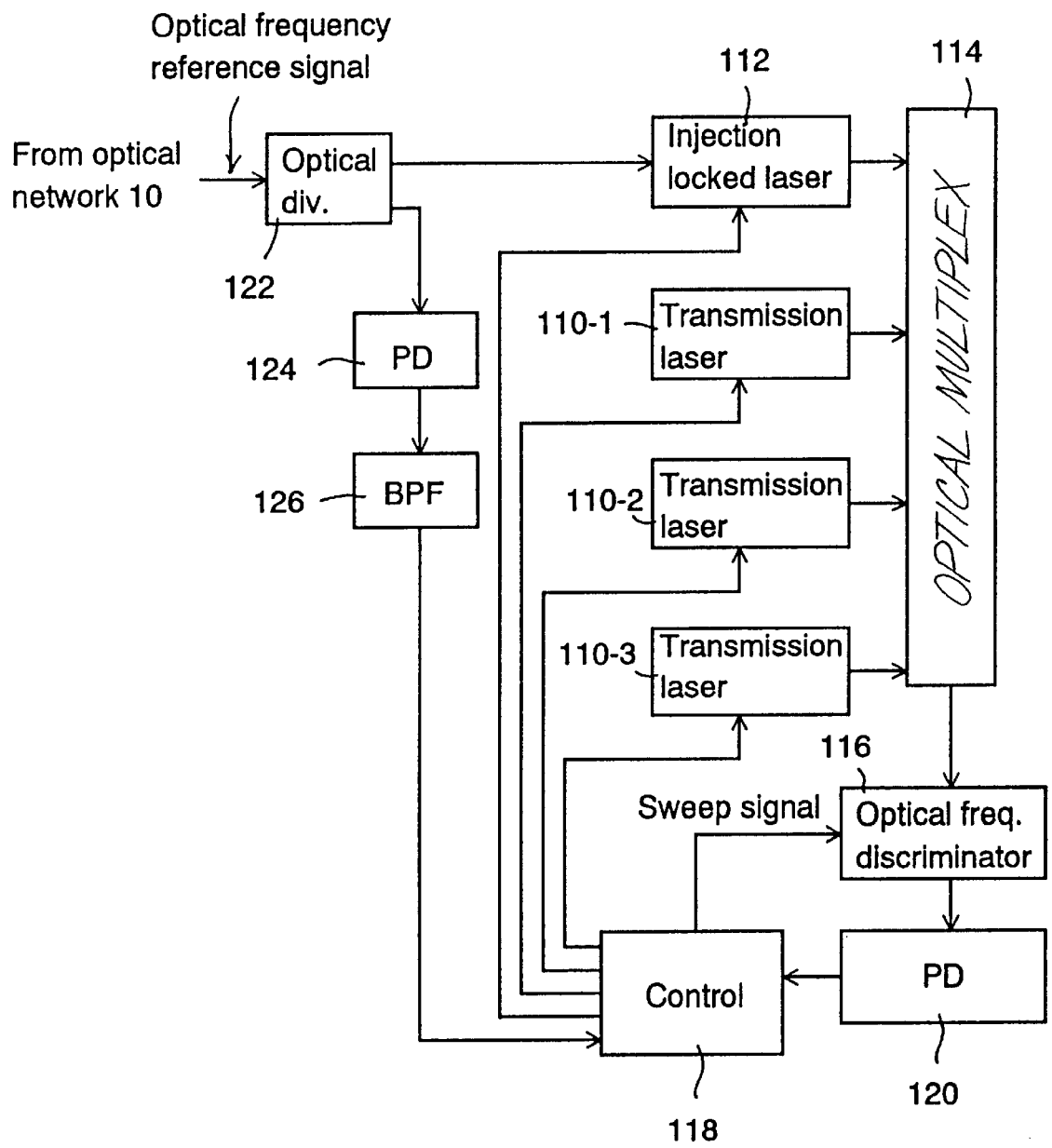
FIG. 3 is a schematic block diagram showing a general construction of a second embodiment of the invention.

FIG. 3 is a schematic block diagram showing a general construction of a modified embodiment having an additional mechanism for detecting whether the optical frequency reference light is entering or not from the optical network 10. In this embodiment, the optical frequency reference light is intensity-modulated using a specific frequency.

Numerals 110-1, 110-2 and 110-3 denote transmission laser devices, 112 an injection-locked laser device; 114 an optical multiplexer; 116 an optical frequency discriminator typically in form of a scanning Fabry-Perot interferometer; 118 a control device for supplying a sweep signal to the optical frequency discriminator 116 to control and stabilize laser oscillation frequencies of the transmission laser devices 110-1, 110-2, 1103; and 120 a photodetector for converting an output of the optical frequency discriminator 116 (sweep output) into an electric signal. The transmission laser devices 110-1, 110-2, 110-3, injection-locked laser device 112, optical multiplexer 114, optical frequency discriminator 116 and photodetector 120 are identical to the transmission laser devices 40-1, 40-2, 40-3, injection-locked laser device 42, optical multiplexer 46, optical frequency discriminator 48 and photodetector 52 in the embodiment shown in FIG. 1, respectively, and also their basic behaviors are essentially identical to those of the embodiment shown in FIG. 1.

The control device 118 includes essentially identical elements to those of the control device 50. A frequency control device corresponding to the frequency control device 64 of the control device 50 controls and adjusts the entirety, in particular, driving condition of the injection-locked laser device 112 according to the detected result of the entry/none-entry of the optical frequency reference light from the optical network 10. That is, this embodiment is identical to the embodiment of the invention in that the laser oscillation frequencies of the transmission laser devices 110-1 to 110-3 are controlled and stabilized by the frequency of the optical frequency reference light from the optical network 10 or of the optical output from the injection-locked laser device 112 with the control device 118.

Detailed explanation is made below about differences of this embodiment from the embodiment shown in FIG. 1. The optical divider 122 divides the optical frequency reference light from the optical network 10 into two parts, and supplies one to the injection-locked laser device 112 and the other to the photodetector 124. The photodetector 124 converts the optical frequency reference light from the optical divider 122 into an electric signal. A bandpass filter 126, whose transmission center frequency is the same as the intensity-modulated frequency of the optical frequency reference light, extracts the intensity-modulation frequency of the optical frequency reference light from the output of the photodetector 124, and applies the extracted frequency component to the control device 118. When the optical frequency reference light enters from the optical network 10, the output level of the bandpass filter 126 becomes high. When the optical frequency reference light does not enter from the optical network 10, the output level of the bandpass filter 126 becomes substantially zero. Therefore, the control device 118 can detect from output of the bandpass filter 126 whether the optical frequency reference light from the optical network enters or not.

When the optical frequency reference light enters from the optical network 10, the control device 118 drives the injection-locked laser device 112 under a drive current, operation temperature, etc. adjusted to bring the oscillation frequency nearest to the optical frequency of the optical frequency reference light. Since the optical frequency reference light currently enters, the injection-locked laser device 112 oscillates at the same frequency as that of the optical frequency reference light. Concurrently, the control device 118 measures the time required from the start point of the sweep cycle of the optical frequency discriminator 116 to the optical output of the injection-locked laser device 112, and provisionally stores the result in its internal memory.

When it is detected from an output of the bandpass filter 126 that the optical frequency reference light from the optical network 10 has been shut off, the control device 118 refers to the result of measurement of the laser oscillation frequency of the injection-locked laser device 112 stored during entry of the optical frequency reference light to adjust the drive current, operation temperature, etc. of the injection-locked laser device 112 to values for equalizing its oscillation frequency to the stored frequency, and maintains the adjusted values. When the optical frequency reference light again enters from the optical network 10, the control device 118 stores results of measurement of the laser oscillation frequency of the injection-locked laser device 112 one after another.

Considering that the measurement accuracy of the optical frequency discriminator 116 may vary with time, it is desirable to store a plurality of results of some occurrences of measurement of the laser oscillation frequency of the injection-locked laser device 112 effected within a predetermined time to use their statistically processed value (for example, mean value) as a target value for controlling the injection-locked laser device 112 while the optical frequency reference light from the optical network 10 is shut off.

The embodiment shown in FIG. 3 is configured to store information indicating the laser oscillation frequency of the injection-locked laser device 112 while the optical frequency reference light enters from the optical network 10 and to control driving conditions of the injection-locked laser device 112 such that its laser oscillation frequency while the optical frequency reference light does not enter from the optical network 10 be equalized to the laser oscillation frequency while the optical frequency reference light enters from the optical network 10. In this manner, even when the optical frequency reference light does not enter from the optical network 10, the injection-locked laser device 112 can be activated for laser oscillation at the same frequency as that of the optical frequency reference light, and laser oscillation frequencies of respective transmission laser devices 110-1, 110-2, 110-3 can be stabilized with a high accuracy.

Figure 4:
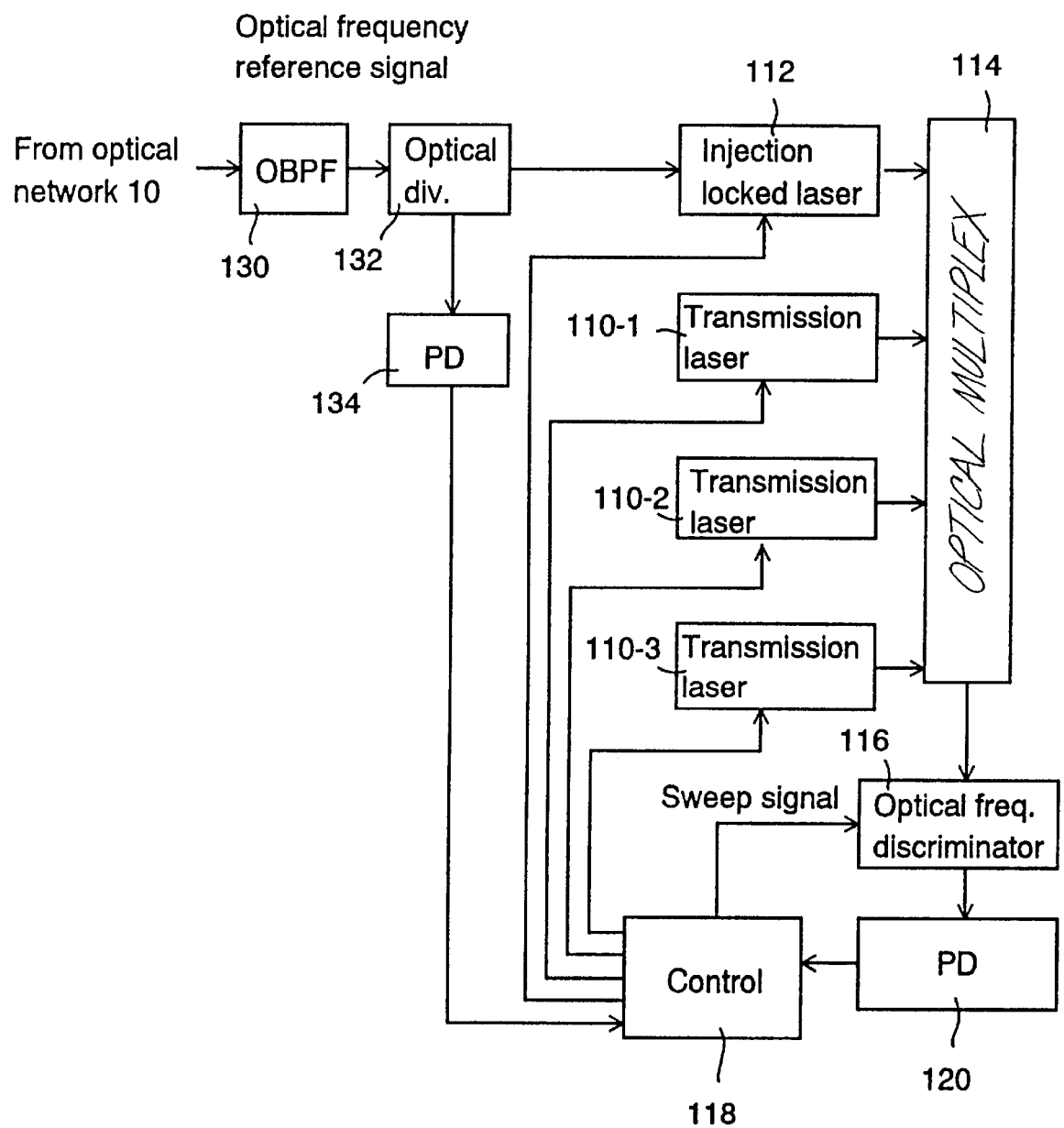
FIG. 4 is a schematic block diagram showing a general construction of a third embodiment of the invention.
Figure 5:
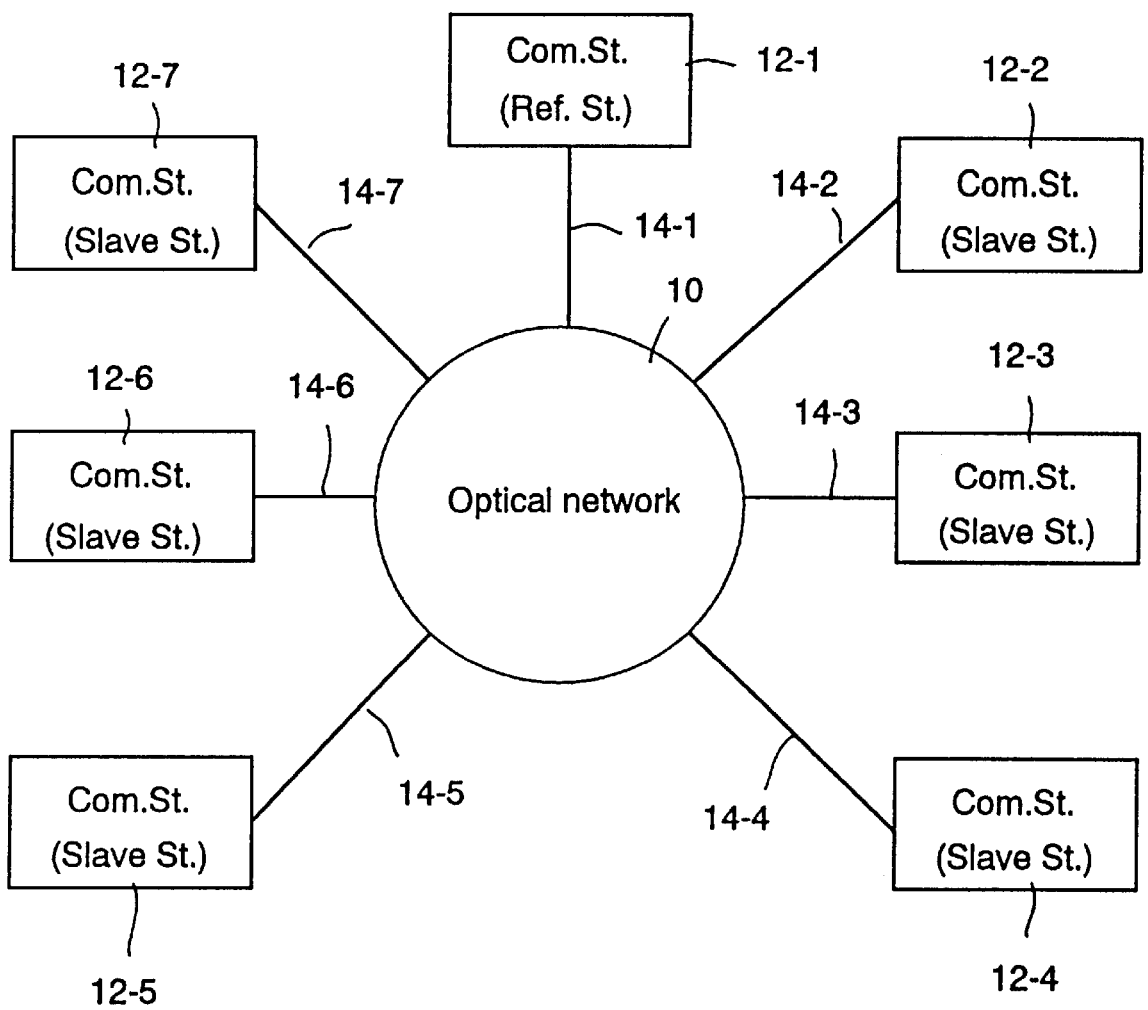
FIG. 5 is a schematic block diagram showing a general construction of an optical network system.

The mechanism for detecting entry or non-entry of the optical frequency reference light can be modified as shown in FIG. 4 by locating the optical filter for extracting the optical frequency reference light from optical signals propagating through the optical network 10 nearer to the optical network 10. Parts or elements identical or equivalent to those of FIG. 3 are labelled with common reference numerals. In this case, unlike the arrangement of FIG. 3, the optical frequency reference light need not be intensity-modulated.

An optical bandpass filter 130 transmits the optical frequency reference light alone among optical signals from the optical network 10. An optical divider 132 divides optical output of the optical bandpass filter 130 into two parts, and applies one to the injection-locked laser device 112 and the other to a photodetector 134. Output of the photodetector 134 is applied to the control device 118. Output of the photodetector 134 becomes a high level when the optical frequency reference light enters from the optical network 10, and becomes substantially zero when the optical frequency reference light does not enter from the optical network 10. Therefore, like that of the embodiment of FIG. 3, the control device 118 can detect from outputs of the photodetector 134 whether the optical frequency reference light enters or not from the optical network 10.

As compared with the embodiment of FIG. 3, the embodiment of FIG. 4 has the advantage that the optical frequency reference light need not be intensity-modulated. The other advantages of behaviors are identical to those of the embodiment shown in FIG. 3.

Although the invention has been explained by way of embodiments using optical frequency discriminators 48, 116 which include mechanically movable elements, another type of frequency discriminator means with no mechanically movable elements can be used. For example, a combination of an optical divider, such as spectroscopic prism, and an photodetecting element array, or means for wavelength-demultiplexing an optical output within a desired wavelength range, such as arrayed waveguide grating, can be used, although their wavelength-demultiplexing properties should be taken into consideration.

As explained above, according to the invention, since the device uses a laser device which oscillates at a frequency identical to that of optical frequency reference light while the optical frequency reference light enters from the outside and oscillates at the same frequency as that of the optical frequency reference light also when the external optical frequency reference light is shut off, it can stabilize laser oscillation frequencies of transmission laser devices with high accuracy even when the external optical frequency reference light is shut off.

What is claimed is:

1. An optical frequency stabilizing device comprising:
   an externally controllable optical shutter for passing or blocking an optical frequency reference light having a reference frequency;
   an injection-locked laser having an optical output with a frequency substantially equal to the reference frequency when said optical frequency reference light is passed by the optical shutter;
   a transmission laser for outputting transmission laser light having a frequency;
   an optical multiplexer having a multiplexed optical output comprising the optical output from said injection-locked laser and the transmission laser light;
   spectroscopic means for spectrally measuring the multiplexed optical output; and a control device for controlling the frequency of the transmission laser light as a function of said spectroscopic means, and controlling said optical shutter to pass or block said optical frequency reference light, said control device controlling the frequency of the optical output from said injection-locked laser to be substantially equal to the frequency of said optical frequency reference light when said optical frequency reference light is blocked by the optical shutter.

2. The optical frequency stabilizing device according to claim 1 wherein said control device generates a sweep signal, and said spectroscopic means comprises an optical frequency discriminator for scanning the multiplexed optical output across an optical frequency band in response to the sweep signal, and a photodetector for converting an output of said optical frequency discriminator into an electrical signal.

3. An optical frequency stabilizing device comprising:

an injection-locked laser for receiving an optical frequency reference light having a reference frequency, said injection-locked laser having an optical output with a frequency substantially equal to the reference frequency;

reference light entry detecting means for detecting entry or non-entry of said optical frequency reference light;

a transmission laser for outputting transmission laser light having a frequency;

an optical multiplexer having a multiplexed optical output comprising the optical output from said injection-locked laser and the transmission laser light;

spectroscopic means for spectrally measuring the multiplexed optical output; and a control device for controlling the frequency of the transmission laser light as a function of said spectroscopic means, said control device storing a measurement representative of the optical output from said injection-locked laser from said spectroscopic means when said reference light entry detecting means detects entry of said optical frequency reference light, and said control device controlling the frequency of the optical output of said injection-locked laser in accordance with the stored measurement when said reference light input detecting means detects non-entry of said optical frequency reference light.

4. The optical frequency stabilizing device according to claim 3 wherein said control device generates a sweep signal, and said spectroscopic means comprises an optical frequency discriminator for scanning the multiplexed optical output across an optical frequency band in response to the sweep signal, and a photodetector for converting an output of said optical frequency discriminator into an electrical signal.

5. The optical frequency stabilizing device according to claim 3 wherein said optical frequency reference light is intensity-modulated using a predetermined frequency, and said reference light entry detecting means comprises a second photodetector for converting light from an optical input port into an electric signal, and a filter for extracting a predetermined frequency component of the light from said second photoconductor.

6. The optical frequency stabilizing device according to claim 3 further comprising an optical divider for dividing an optical output from an optical input port into two parts, one of said two parts being coupled to said injection-locked laser and the other of said two parts being coupled to said reference light entry detecting means.

7. The optical frequency stabilizing device according to claim 3 wherein said reference light entry detecting means comprises an optical filter for extracting an optical frequency component of said optical frequency reference light, and a second photodetector for converting the extracted component of the optical frequency reference into an electric signal.

8. The optical frequency stabilizing device according to claim 7 wherein said reference light entry detecting means further comprises an optical divider for dividing an optical output of said optical filter into two parts, one of said two parts being coupled to said second photoconductor, and the other of said two parts being coupled to said injection-locked laser.

9. The optical frequency stabilizing device according to claim 2 wherein said control device further comprises:

a time measuring circuit for measuring time, at an output of the photodetector, between the optical output from said injection-locked laser and the transmission laser light;

a transmission laser driver for driving said transmission laser;

an injection-locked laser driver for driving said injection-locked laser; and a frequency control device for controlling said transmission laser driver to adjust the frequency of the transmission laser light in accordance with the measured time from the time measuring circuit, and for controlling said injection-locked laser driver to adjust the frequency of the optical output of the injection-locked laser to be substantially equal to the frequency of said optical frequency reference light in accordance with the measured time when said optical frequency reference light is blocked by the optical shutter.

10. The optical frequency stabilizing device according to claim 9 wherein the frequency of the transmission light is adjusted in accordance with a comparison between the measured time from the time measuring circuit and a desired value for said transmission laser.

11. The optical frequency stabilizing device according to claim 1 wherein the optical output of the injection-locked laser has a frequency substantially synchronized with the reference frequency when said optical frequency reference light is passed by the optical shutter.

12. The optical frequency stabilizing device according to claim 4 wherein said control means further comprises:

a time measuring circuit for measuring time, at an output of the photodetector, between the optical output from said injection-locked laser and the transmission laser light;

a transmission laser driver for driving said transmission laser;

an injection-locked laser driver for driving said injection-locked laser; and a frequency control device for controlling said transmission laser driver to adjust the frequency of the transmission laser light in accordance with the measured time from the time measuring circuit, and for controlling said injection-locked laser driver to adjust the frequency of the optical output of the injection-locked laser to be substantially equal to the frequency of said optical frequency reference light in accordance with the measured time when said reference light input detecting means detects non-entry of said optical frequency reference light.

13. The optical frequency stabilizing device according to claim 12 wherein the frequency of the transmission light is adjusted in accordance with a comparison between the measured time from the time measuring circuit and a desired value for said transmission laser.

14. The optical frequency stabilizing device according to claim 3 wherein the optical output of the injection-locked laser has a frequency substantially synchronized with the reference frequency when said reference light input detecting means detects entry of said optical frequency reference.

* * * * *

UNITED STATES PATENT AND TRADEMARK OFFICE
CERTIFICATE OF CORRECTION

PATENT NO. : 5,898,719
DATED : April 27, 1999
INVENTOR(S) : Shiro Ryu

It is certified that error appears in the above-identified patent and that said Letters Patent is hereby corrected as shown below:

On the title page, Item [22] should read:
-- Filed: August 7, 1997 --.
Column 6, line 34, change "1103" to -- 110-3 --.

Signed and Sealed this

Fourteenth Day of March, 2000

Attest:

Q. TODD DICKINSON

Attesting Officer     Commissioner of Patents and Trademarks